(12) United States Patent
Gurney et al.

(10) Patent No.: US 8,189,302 B2
(45) Date of Patent: May 29, 2012

(54) MAGNETIC FIELD SENSOR WITH GRAPHENE SENSE LAYER AND FERROMAGNETIC BIASING LAYER BELOW THE SENSE LAYER

(75) Inventors: Bruce Alvin Gurney, San Jose, CA (US); Ernesto E. Marinero, Saratoga, CA (US); Simone Pisana, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 5 days.

(21) Appl. No.: 12/880,071

(22) Filed: Sep. 11, 2010

(65) Prior Publication Data

US 2012/0063033 A1    Mar. 15, 2012

(51) Int. Cl.
*G11B 5/33*    (2006.01)
(52) U.S. Cl. .................... 360/313; 360/315; 360/324
(58) Field of Classification Search .................. 360/313, 360/315, 324
See application file for complete search history.

(56) References Cited

U.S. PATENT DOCUMENTS

| | | | |
|---|---|---|---|
| 4,163,986 A | 8/1979 | Vinal | |
| 6,650,513 B2 | 11/2003 | Fullerton et al. | |
| 7,167,346 B2* | 1/2007 | Carey et al. | 360/313 |
| 7,170,722 B2 | 1/2007 | Carey et al. | |
| 7,203,036 B2 | 4/2007 | Chattopadhyay et al. | |
| 7,295,406 B2 | 11/2007 | Chattopadhyay et al. | |
| 7,466,521 B2 | 12/2008 | Boone, Jr. et al. | |
| 2004/0218309 A1* | 11/2004 | Seigler | 360/313 |
| 2010/0061014 A1 | 3/2010 | Das et al. | |
| 2010/0109712 A1* | 5/2010 | Zaliznyak et al. | 327/100 |

FOREIGN PATENT DOCUMENTS

WO    WO 2008130465 A2 *    10/2008

OTHER PUBLICATIONS

Oshima et al., Surface Review Letters 7, p. 521 (2000) [Abstract Only].
Morozov et al., "Giant Intrinsic Carrier Mobilities in Graphene and Its Bilayer", PRL 10, 016602, 2008.
Pisana et al., "Tunable Nanoscale Graphene Magnetometers", Nano Lett. 10, 341, 2010.
Pisana et al., "Graphene Magnetic Field Sensors", IEEE Transactions on Magnetics, 46, 1910, Jun. 2010.
Zhang, et al., "Tuning the magnetic and electronic properties of bilayer graphene nanoribbons on Si(001) by bias voltage", Physical Review B 81, 155428 (2010).

* cited by examiner

*Primary Examiner* — Daniell L Negron
*Assistant Examiner* — Carlos E Garcia
(74) *Attorney, Agent, or Firm* — Thomas R. Berthold (57) ABSTRACT

A graphene magnetic field sensor has a ferromagnetic biasing layer located beneath and in close proximity to the graphene sense layer. The sensor includes a suitable substrate, the ferromagnetic biasing layer, the graphene sense layer, and an electrically insulating underlayer between the ferromagnetic biasing layer and the graphene sense layer. The underlayer may be a hexagonal boron-nitride (h-BN) layer, and the sensor may include a seed layer to facilitate the growth of the h-BN underlayer. The ferromagnetic biasing layer has perpendicular magnetic anisotropy with its magnetic moment oriented substantially perpendicular to the plane of the layer. The graphene magnetic field sensor based on the extraordinary magnetoresistance (EMR) effect may function as the magnetoresistive read head in a magnetic recording disk drive.

21 Claims, 5 Drawing Sheets

FIG. 5
*(Prior Art)*

MAGNETIC FIELD SENSOR WITH GRAPHENE SENSE LAYER AND FERROMAGNETIC BIASING LAYER BELOW THE SENSE LAYER

BACKGROUND OF THE INVENTION

1. Field of the Invention

The invention relates generally to magnetic field sensors, and more particularly to a magnetic field sensor with a graphene sense layer.

2. Description of the Related Art

A magnetic field sensor based on extraordinary magnetoresistance (EMR) has been proposed as a magnetoresistive read-head sensor for magnetic recording hard disk drives. The sense layer in an EMR sensor formed of nonmagnetic III-IV semiconductor materials does not suffer from the problem of magnetic noise that exists in read-head sensors based on giant magnetoresistance (GMR) and tunneling magnetoresistance (TMR), both of which use magnetic films as their sense layers. The operation and structure of EMR sensors with III-IV semiconductor sense layers for read-head applications are described by S. A. Solin et al., "Nonmagnetic semiconductors as read-head sensors for ultra-high-density magnetic recording", *Appl. Phys. Lett., Vol.* 80, No. 21, 27 May 2002, pp. 4012 4014; and in U.S. Pat. No. 7,167,346 B2; U.S. Pat. No. 7,170,722 B2 and U.S. Pat. No. 7,203,036 B2; all assigned to the same assignee as this application.

More recently an EMR sensor with a graphene sense layer has been proposed. A graphene magnetic field sensor provides a graphene sense layer only a few atomic layers thick and is thus promising for the detection of nanometer-sized magnetic domains. Graphene is a single atomic sheet of graphitic carbon atoms that are arranged into a honeycomb lattice. It can be viewed as a giant two-dimensional Fullerene molecule, an unrolled single wall carbon nanotube, or simply a single layer of lamellar graphite crystal. Charge carrier mobility values as high as 200,000 $cm^2/Vs$ at room temperature are achievable, as described by Morozov et al., *PRL* 10, 016602, 2008. Pending application Ser. No. 12/539,437 filed Aug. 11, 2009 and assigned to the same assignee as this application, describes a tunable graphene magnetic field sensor. The magnetic field sensitivity and the electrical resistance of the graphene sensor can be tuned by the electric field effect, with the highest sensitivity being when the electrical resistance is at its peak, namely when the electric field from a gate bias voltage penetrating the graphene sense layer causes charge transport to take place via electrons and holes simultaneously. In this high sensitivity regime, the response of the sensor as a function of the applied external magnetic field exhibits a super-linear dependence, with minimum sensitivity around zero magnetic field.

Thus it is desirable to impose a static magnetic biasing field to the graphene sensor such that the operating regime of the sensor is shifted to sensitivity values otherwise unattainable. The static magnetic biasing field has the additional advantage of linearizing the signal response of the sensor, which is a desirable feature for electrical detection of the sensor's response. However, the static magnetic biasing field must not be so great as to adversely affect the write head or the magnetic recording media if the sensor is used as a magnetoresistive read head in a magnetic recording disk drive. Also, if a ferromagnetic layer is used as the static magnetic biasing field it must be located in close proximity to the graphene sense layer without causing electrical shorting of the graphene sense layer.

What is needed is a graphene magnetic field sensor with a ferromagnetic biasing layer that provides the desired static magnetic biasing field and is located in close proximity to the graphene sense layer without causing electrical shorting of the graphene sense layer.

SUMMARY OF THE INVENTION

The invention relates to a graphene magnetic field sensor with a ferromagnetic biasing layer located beneath and in close proximity to the graphene sense layer. The sensor includes a suitable substrate, the ferromagnetic biasing layer, the graphene sense layer, and an electrically insulating underlayer between the ferromagnetic biasing layer and the graphene sense layer. The underlayer is preferably a hexagonal boron-nitride (h-BN) layer, and the sensor may include a seed layer to facilitate the growth of the h-BN underlayer. The ferromagnetic biasing layer has perpendicular magnetic anisotropy with its magnetic moment oriented substantially perpendicular to the plane of the layer. The graphene sense layer may be a single atomic layer, but is preferably not greater than about 10 atomic layers thick. The graphene magnetic field sensor based on the extraordinary magnetoresistance (EMR) effect may function as the magnetoresistive read head in a magnetic recording disk drive.

The ferromagnetic biasing layer may be a granular hexagonal-close-packed (hcp) Co alloy, or a multilayer with perpendicular magnetic anisotropy like a Co/Ni, Co/Pt, Co/Pd, Fe/Pt or Fe/Pd multilayer, or a chemically-ordered binary alloy like CoPt, CoPd, FePt, FePd, $CoPt_3$, $Co_3Pt$, $CoPd_3$ and $Co_3Pd$, or a pseudo-binary alloys based on the CoPt and FePt $L1_0$ phase. The ferromagnetic biasing layer may also be an antiferromagnetic/ferromagnetic (AF/F) bilayer structure.

For a fuller understanding of the nature and advantages of the present invention, reference should be made to the following detailed description taken together with the accompanying figures.

DETAILED DESCRIPTION OF THE INVENTION

This invention relates to a graphene magnetic field sensor where the graphene sense layer is located on layers that provide electrostatic gating through the electric field effect and a static magnetic field bias. The layered structure ensures that the graphene sense layer is not electrically shorted by the ferromagnetic biasing material used to provide the electrostatic gating and static magnetic field bias. Additionally, the materials comprising the layered structure described in the preferred embodiments allow for the growth of the graphene layer, providing for relatively easy fabrication of the sensor. The spacer material separating the graphene sense layer and the ferromagnetic biasing material increases the sensitivity of the sensor by reducing charge impurity scattering and hence increasing charge carrier mobility, as described in pending application Ser. No. 12/563,446, filed Sep. 21, 2009 and assigned to the same assignee as this application. The graphene magnetic field sensor based on the extraordinary magnetoresistance (EMR) effect according to this invention may be used as a magnetoresistive read head in a magnetic recording disk drive.

Figure 1:
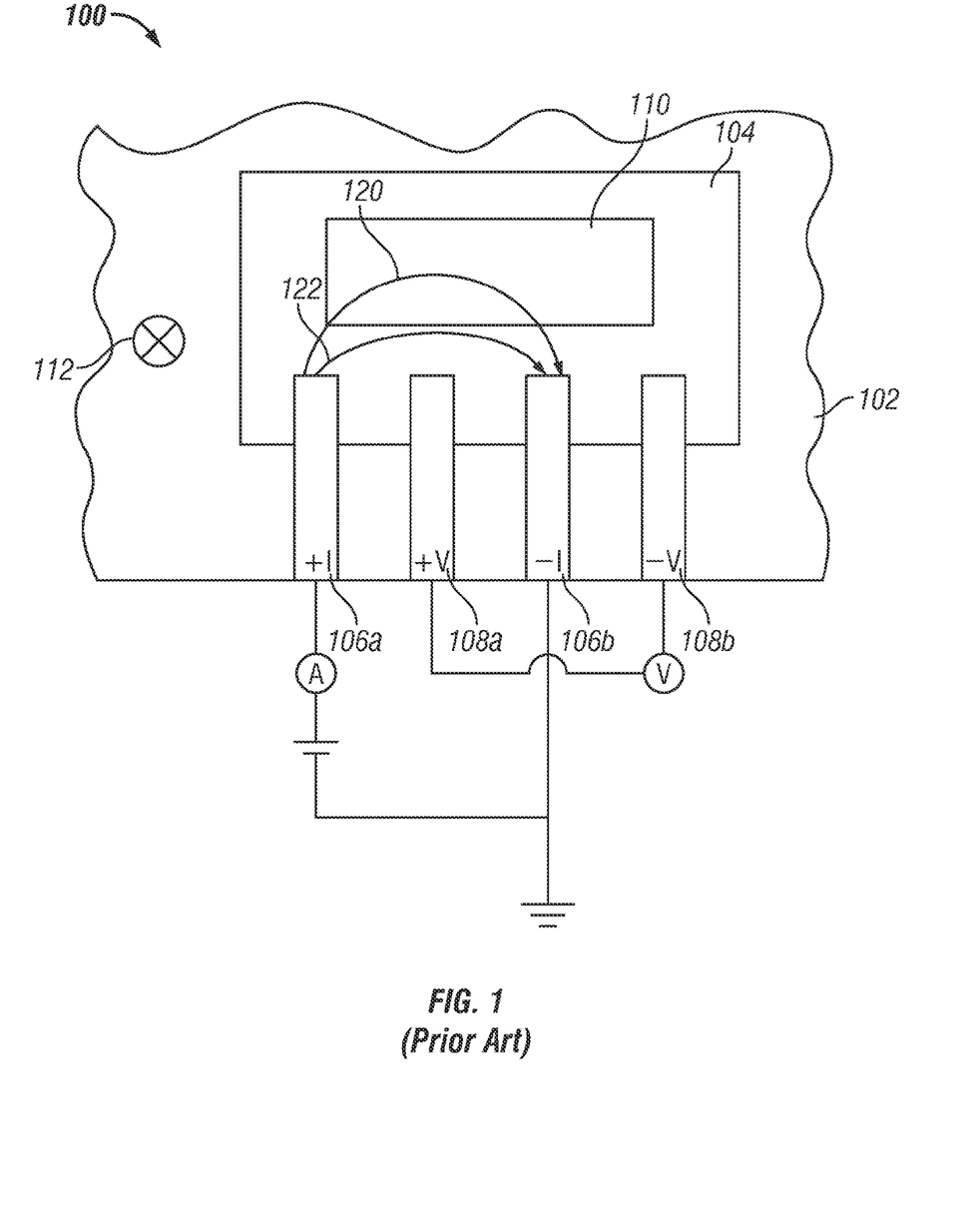
FIG. 1 is a schematic of a graphene magnetic field sensor based on the extraordinary magnetoresistance (EMR) effect.

FIG. 1 is a schematic of a graphene magnetic field sensor 100 based on the extraordinary magnetoresistance (EMR) effect. The sensor 100 may function as a magnetoresistive read head in a magnetic recording disk drive. The sensor 100 includes a substrate 102, the graphene sense layer 104, a pair of current electrodes 106a, 106b, a pair of voltage electrodes 108a, 108b, and an electrically conductive shunt 110. A graphene EMR sensor like that depicted in FIG. 1 was fabricated with a single atomic layer of graphene and with electrode lead widths of 200 nm. (See Pisana et al., *Nano Lett.* 10, 341, 2010 and Pisana et al., *IEEE Transactions on Magnetics*, 46, 1910, 2010). The Raman spectrum confirmed that the graphene layer was a monolayer. Current is injected through the +I electrode 106a and extracted through the −I electrode 106b. As indicated in FIG. 1, the current path through the graphene sense layer 104 is influenced by the external magnetic field 112. With no external magnetic field, current flows predominantly through the shunt 110, as shown by arrow 120, whereas in the presence of an external magnetic field 112 a significant change occurs in the portion of the current flowing through the graphene sense layer 104, as shown by arrow 122. Therefore, a significant change in electrical current flow is observed in response to the interactions of the external magnetic field with the charge carriers on account of the Lorentz force. This is observed by measuring the change in voltage ($V_{diff}$) across the +V and −V electrodes 108a, 108b.

Figure 2:
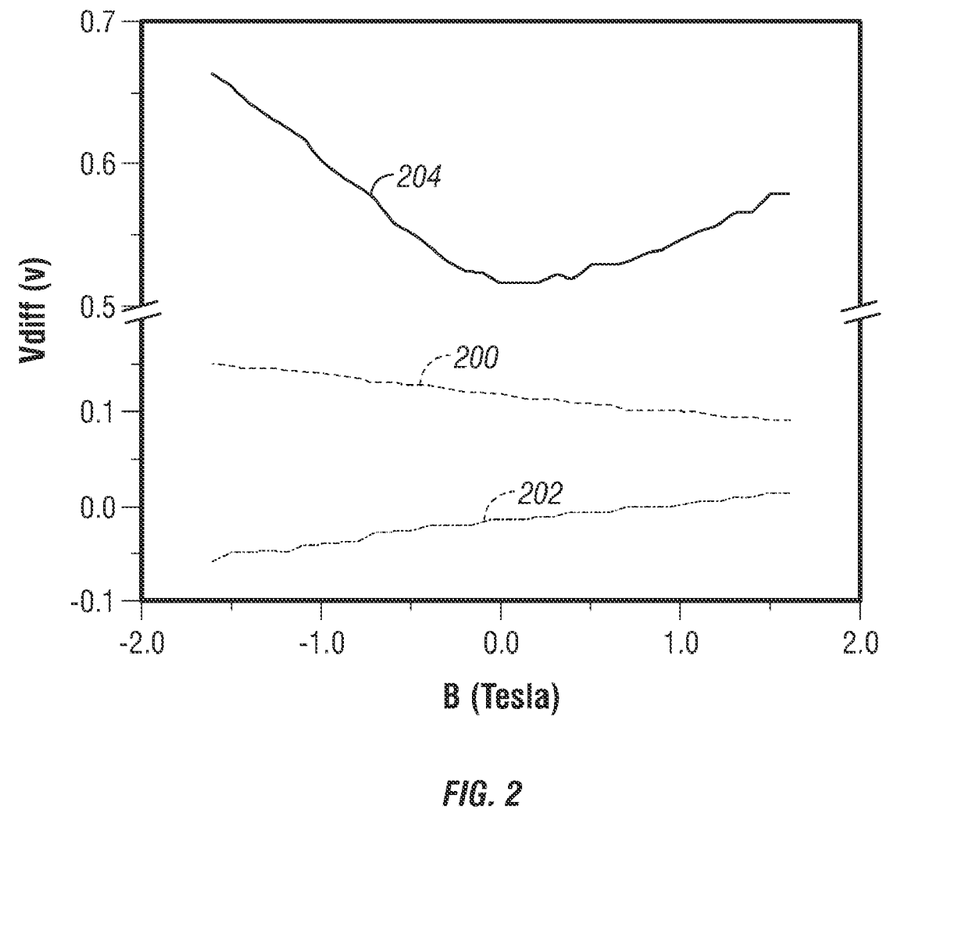
FIG. 2 is a graph showing changes in differential output voltage ($V_{diff}$ as a function of applied external magnetic field B) of a graphene EMR sensor for different values of electrostatic gate bias voltage.

Changes in differential output voltage ($V_{diff}$ as a function of applied external magnetic field B) of a graphene EMR sensor for different values of electrostatic gate bias voltage are shown in FIG. 2 for a representative EMR device built with graphene. Curve 200 is for a +30 V gate bias, which corresponds to a regime wherein the transport charge carriers are electrons, and curve 202 is for a −30 V gate bias, which corresponds to a regime wherein the transport charge carriers are holes. At zero gate bias (curve 204), both electrons and holes participate in the transport. In this regime a nonlinear essentially quadratic behavior of the sensitivity response is observed, as shown by curve 204. Though nonlinear over large external magnetic field variations, the response of curve 204 can be considered to be approximately linear for small variations in external magnetic fields above a static magnetic bias, for example, 1 Tesla. FIG. 2 also shows that the sensitivity to small variations in external magnetic fields is approximately 3 times greater for zero gate bias versus +/−30 V gate bias, as can be seen by comparing the slopes of the curves near zero and −1 Tesla. Although both electrons and holes participate in the transport at zero gate bias, a nonzero gate bias may be necessary to achieve the highest magnetic field sensitivity in sensors which have higher amounts of extrinsic doping.

To take advantage of the increased sensitivity afforded by a graphene EMR sensor operating with a gate bias voltage such that transport employs electrons and holes as charge carriers, it is desirable to provide a biasing magnetic field. In this invention this is accomplished through the growth of a ferromagnetic biasing layer (which may be one or more layers) between the substrate and the graphene sense layer, but not in contact with the graphene sense layer. The magnetic moment from the ferromagnetic biasing layer is a biasing magnetic field to which the graphene sense layer is exposed. This shifts the magnetoresistance vs. field response curve so that at zero applied external magnetic field the sensor has a higher magnetoresistance and a more linear response.

Figure 3:
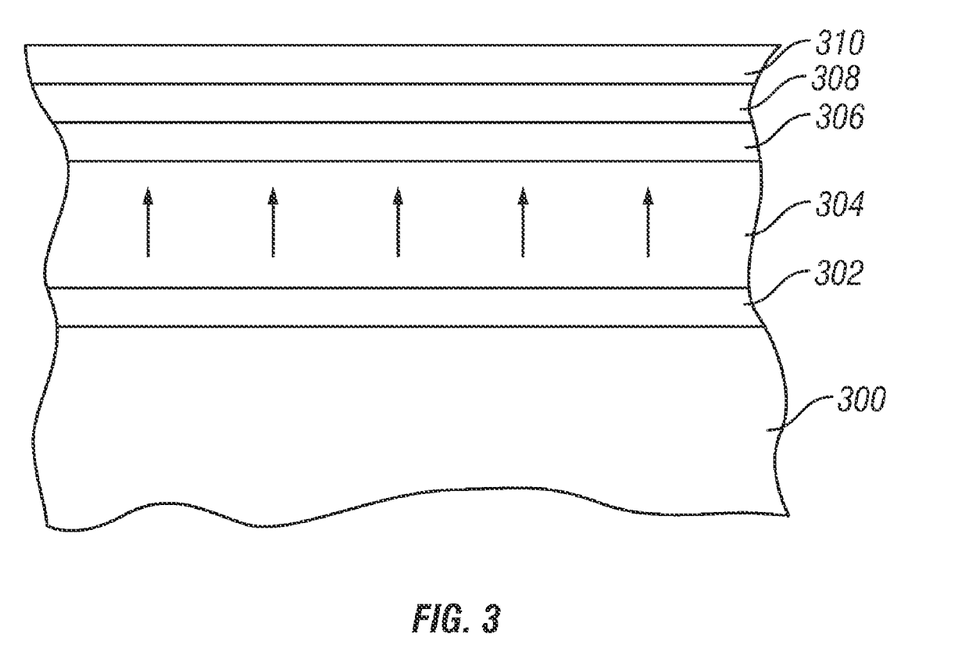
FIG. 3 is a cross-sectional view of the layers of the graphene magnetic field sensor of this invention showing the ferromagnetic biasing layer beneath the graphene sense layer.

FIG. 3 is a cross-sectional view of the layers of the graphene magnetic field sensor of this invention. The sensor includes a suitable substrate 300, for example Si, glass, or AlTiC, a first seed layer 302 to facilitate growth of the ferromagnetic biasing layer 304, the graphene sense layer 310, an electrically insulating underlayer 308, such as a hexagonal boron-nitride (h-BN) layer, for the graphene sense layer 310, and a second seed layer 306, such as Ni(111) layer, to facilitate the growth of the h-BN underlayer 308. The ferromagnetic biasing layer 304 has perpendicular magnetic anisotropy with its magnetic moment oriented substantially perpendicular to the plane of the layer 304, as represented by the arrows in FIG. 3. The choice of the materials, composition and thicknesses for the ferromagnetic biasing layer 304 and its seed layer 302 determines the magnitude of the magnetic bias field, which would typically be between about 0.2 and 2.0 Tesla, depending on the value of the charge carrier mobility in the graphene layer. Typical thicknesses for the layers are one atomic layer to 20 nm for the seed layer 306 and 1 to 10 atomic layers for the electrically insulating h-BN layer 308. The seed layer 306 may not be necessary if the ferromagnetic biasing layer 304 allows for the growth of the h-BN layer. The graphene sense layer 310 may be a single atomic layer, but is preferably not greater than about 10 atomic layers thick.

The ferromagnetic biasing layer 304 may be a granular hexagonal-close-packed (hcp) Co alloy, such as the well-known CoPt or CoPtCr alloys used in perpendicular magnetic recording disks. The ferromagnetic biasing layer 304 may also be a multilayer with perpendicular magnetic anisotropy, like a Co/Ni, Co/Pt, Co/Pd, Fe/Pt or Fe/Pd multilayer. The ferromagnetic biasing layer 304 may also be one of the well-known chemically-ordered binary alloys CoPt, CoPd, FePt, FePd, $CoPt_3$, $Co_3Pt$, $CoPd_3$ and $Co_3Pd$ or pseudo-binary alloys based on the CoPt and FePt $L1_0$ phase. Chemically-ordered alloys of CoPt, CoCrPt, CoPd, FePt and FePd (all ordered in $L1_0$ or $L1_1$) and $CoPt_3$, $Co_3Pt$ and $CoPd_3$ (all ordered in $L1_2$) in their bulk form, are known for their high magneto-crystalline anisotropy and magnetization, properties that are desirable for high-density magnetic recording materials. Pseudo-binary alloys based on the CoPt $L1_1$ and FePt $L1_0$ phase, e.g., $(Co_{(y)}Pt_{(100-y)})$—X and $(Fe_{(y)}Pt_{(100-y)})$—X, where y is between about 45 and 55 atomic percent and the element X may be Ni, Au, Cu, Pd or Ag and is present in the range of between about 0% to about 20% atomic percent, are also suitable high anisotropy materials for use as the ferromagnetic biasing layer 304.

The ferromagnetic biasing layer 304 may also be an anti-ferromagnetic/ferromagnetic (AF/F) bilayer structure. An AF/F bilayer that provides a magnetic field that biases the magnetoresistance vs. field response of a prior art semiconductor-type EMR sensor by being located on top of the EMR sensor is described in U.S. Pat. No. 7,167,346 B2, which is assigned to the same assignee as this application. Perpendicular-to-the-plane exchange-biasing with coercivity enhancement and hysteresis loop-shifts in AF/F structures for which the ferromagnetic layer has an out-of-plane ferromagnetic easy axis is described in U.S. Pat. No. 6,650,513. The magnitude of the perpendicular exchange-bias effect is comparable to that found in similar AF/F structures for which the ferromagnetic layer is exchange-biased in the plane of the layers. The ferromagnetic layer in the AF/F bilayer may be any of the ferromagnetic materials and multilayers described above. The antiferromagnetic layer in the AF/F bilayer is located below the ferromagnetic layer and may be a sufficiently thick Mn alloy layer (PtMn, NiMn, FeMn, IrMn, PdMn, PtPdMn or RhMn). A PtMn layer needs to be thicker than approximately 100 Å to become chemically-ordered and antiferromagnetic when annealed, and an IrMn layer is antiferromagnetic as deposited when it is thicker than approximately 40 Å. These antiferromagnetic Mn alloys may also include small amounts of additional elements, such as Cr, V, Pt, Pd and Ni that are typically added to improve corrosion resistance or increase electrical resistance. Because these antiferromagnetic materials are metallic, it may be desirable to form the antiferromagnetic layer of an electrically insulating material, such as known antiferromagnetic materials formed of a cobalt oxide, a nickel oxide, an oxide of an alloy of cobalt and nickel, and oxides of iron, such as $Fe_2O_3$.

The choice of the first seed layer 302 depends on the material chosen for the ferromagnetic biasing layer 304. For hcp Co alloys, metallic underlayers such as Ru, Ru-alloys and other suitable hcp metals can be used as the first seed layer 302. For chemically-ordered layers, like FePt layers, MgO may be used as first seed layer 302. If the ferromagnetic biasing layer 304 is a multilayer with perpendicular magnetic anisotropy, such as a Co/Pt, Co/Pd, Fe/Pt, Fe/Pd or Co/Ni multilayer, then the first seed layer 302 may comprise a Ta layer or Si/Au bilayer with a layer of Pt or Pd on top, i.e., a Si/Au/Pt or Si/Au/Pd trilayer, or Ta/Pt or Ta/Pd bilayer. As one specific example, the first seed layer 302 may be a bilayer of Ta(15 Å)/Pd(30 Å) and the ferromagnetic biasing layer 304 may be a multilayer of 8 pairs of Co(2.8 Å)/Pd(9 Å). For a ferromagnetic biasing layer 304 formed as a AF/F bilayer, if the antiferromagnetic layer is a Mn based alloy, then the first seed layer 302 located below the antiferromagnetic layer in the AF/F bilayer may be formed of Ta or Ru.

The graphene sense layer 310 is grown on the underlayer 308. The preferred underlayer 308 is h-BN, as described by Oshima et al., *Surface Review Letters* 7, p. 521 (2000). The ferromagnetic biasing layer 304 may not provide good lattice matching for the growth of the h-BN underlayer 308, so a second seed layer 306 may be required. This may be a Ni(111) layer. Other materials suitable for second seed layer 306 include Cu(111), Rh(111), Ru(001), Ru(111), Ru(0001), Pt(111), Pd(111), Ir(111), Co(0001), or other layers with an atomic lattice that allows for epitaxial growth of the h-BN underlayer 308. The layers formed on substrate 300 in FIG. 3 may be deposited by any of the well-known thin film deposition techniques, including sputtering, ion-beam deposition, e-beam evaporation, and chemical vapor deposition.

Figure 4A:
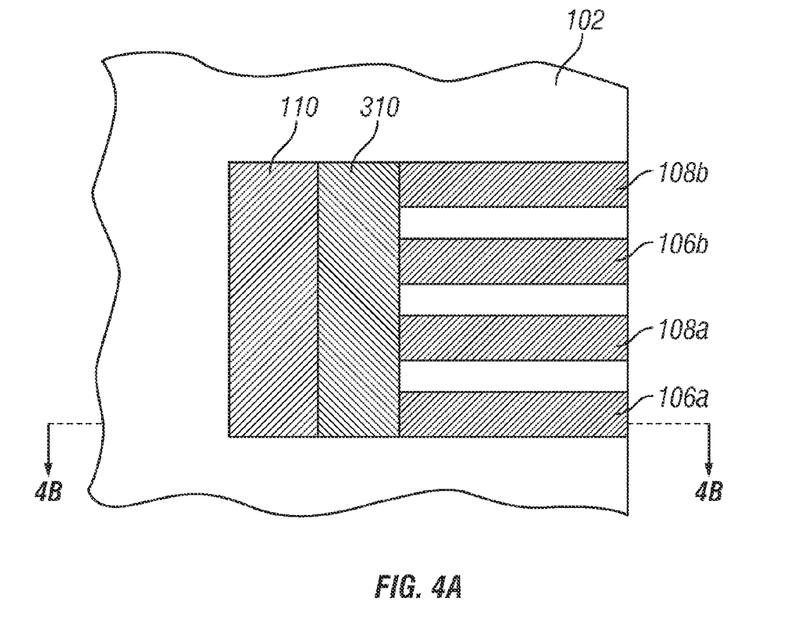
FIG. 4A is a top view of the graphene EMR sensor according to the invention, showing the graphene sense layer, electrical shunt and electrodes in outline.
Figure 4B:
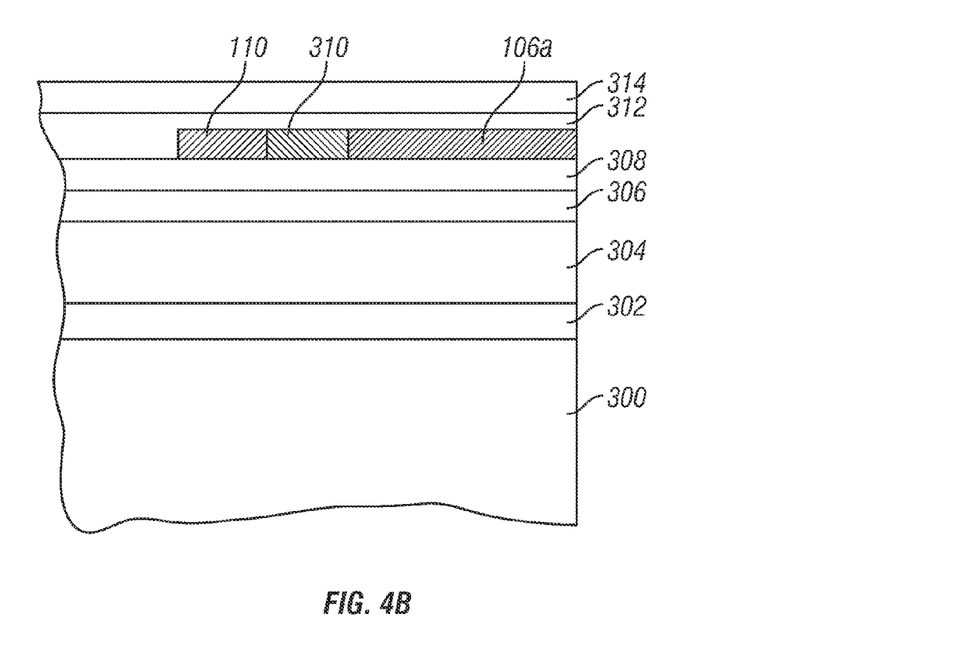
FIG. 4B is a sectional view through section 4B-4B of FIG. 4A.

FIG. 4A is a top view of the completed EMR sensor, like that depicted in FIG. 1, showing the graphene sense layer 310, shunt 110 and electrodes 106a, 106b, 108a and 108b in outline. FIG. 4B is a sectional view through section 4B-4B of FIG. 4A. The following describes one method of fabricating the sensor. After all of the layers in the stack of FIG. 3 are deposited as full films on the substrate 300, the structure is lithographically patterned to define the desired shape of graphene sense layer 310. The graphene sense layer 310 is then etched using ion milling or reactive ion etching. A second lithography step then defines the shape for the shunt 110 and electrodes 106a, 106b, 108a and 108b, after which an electrically conducting layer, for example Au or Pd, is deposited to form the shunt 110 and electrodes 106a, 106b, 108a and 108b. The resist is then lifted off. An electrically insulating overlayer 312, such as $SiO_2$, is deposited over the graphene sense layer 310 and electrically conducting layers 110, 106a, 106b, 108a, 108b, and a metallic electrostatic shield layer 314, such as Ta or Ru or Pt, is deposited over the electrically insulating overlayer 312. The electrostatic shield layer 314 protects the graphene sense layer 310 from external electric fields that would otherwise affect the sensor response. The insulating overlayer 312 may have a thickness in the range of 1 to 10 nm and the electrostatic shield layer 314 may have a thickness in the range of 1 to 5 nm. The completed structure may then be covered with an optional protective layer (not shown), such as diamond-like carbon (DLC) or alumina ($Al_2O_3$), which would be deposited over the shield layer 314.

If the ferromagnetic biasing layer 304 is the ferromagnetic material or multilayers described above, other than an AF/F bilayer, the magnetic moment of the ferromagnetic biasing layer 304 is then formed after the fabrication of the sensor is complete by imposing an external magnetic field oriented perpendicular to the planes of the layers of sufficient magnitude to saturate its magnetization.

If the ferromagnetic biasing layer 304 is an AF/F bilayer and the antiferromagnetic layer is a chemically ordered antiferromagnet like PtMn or NiMn, then the structure is annealed in the presence of a magnetic field oriented perpendicular to the planes of the layers. The alloy chemically orders and undergoes a paramagnetic-to-antiferromagnetic phase transition. Upon cooling in the presence of the magnetic field to below the blocking temperature of the antiferromagnet, i.e., the temperature at which the exchange-coupling between the ferromagnetic layer and the antiferromagnetic layer develops, the magnetization direction of the ferromagnetic layer is set and fixed by the antiferromagnetic layer. Alternatively the ferromagnetic layer and antiferromagnetic layer can be deposited at elevated temperature so that chemical order in the antiferromagnetic layer is already induced during the deposition. The structure is then cooled from the deposition temperature through the blocking temperature in a magnetic field oriented perpendicular to the planes of the layers. If a chemically disordered antiferromagnet like IrMn or FeMn is used for the antiferromagnetic layer then no annealing is necessary. It is simply enough to deposit the ferromagnetic layer and antiferromagnetic layer in the presence of a magnetic field oriented perpendicular to the planes of the layers and field cool from above the blocking temperature to well below the blocking temperature in a magnetic field sufficient to substantially saturate the magnetization during cooling.

In this invention the ferromagnetic biasing layer 304 is located below and in very close proximity to the graphene sense layer 310. Its proximity allows for efficient magnetic biasing, and its location below the graphene sense layer (rather than above) permits very small spacing between the sense layer and the top surface of the sensor, and therefore between the sense layer and the disk, thereby increasing its sensitivity and spatial resolution of the sensor as a magnetoresistive read head. This is possible because, unlike prior art III-V semiconductor materials used in an EMR sensor, the graphene sense layer 310 does not require heterostructure layers, which are typically many tens of microns in thickness to obtain desirable electrical characteristics, but rather only an insulating layer as thin as a one atomic layer of h-BN. The III-V semiconductor materials are epitaxial and must be grown on a narrowly defined class of materials with proper crystallographic orientation and substantially the same lattice constant as the III-IV semiconductor materials. In contrast, graphene has been shown to have good properties on amorphous insulators and other surfaces that are not epitaxial, and therefore the ferromagnetic biasing layer can be incorporated below the graphene layer. It would not be practical to attempt to locate a ferromagnetic biasing layer below a III-V semiconductor sense layer because the ferromagnetic biasing layer is typically polycrystalline and of the wrong lattice type and spacing. In the case of III-V semiconductors, efficient magnetic biasing can only be achieved by placing a ferromagnetic biasing layer above the sense layer, but this comes at the cost of increasing the spacing between the sensor and the magnetic field being sensed, unacceptably limiting the sensitivity and resolution.

Also, in the case of an EMR sensor used as a magnetoresistive read head in a disk drive, even if a biasing magnet could be located below the III-IV semiconductor material, such as by thinning the semiconductor wafer, the magnet may erase data and interfere with the magnetic state of the write head. This is because the magnet would have to be large, and thus would apply a magnetic field to the write head and to a considerable area of the media, reducing the stability of the recorded data. In contrast, the invention allows the use of a much smaller magnet that localizes the magnetic field in a small region near the sensor, eliminating fields from the biasing layer at the write head and reducing the size of the magnetic field at the media.

Figure 5:
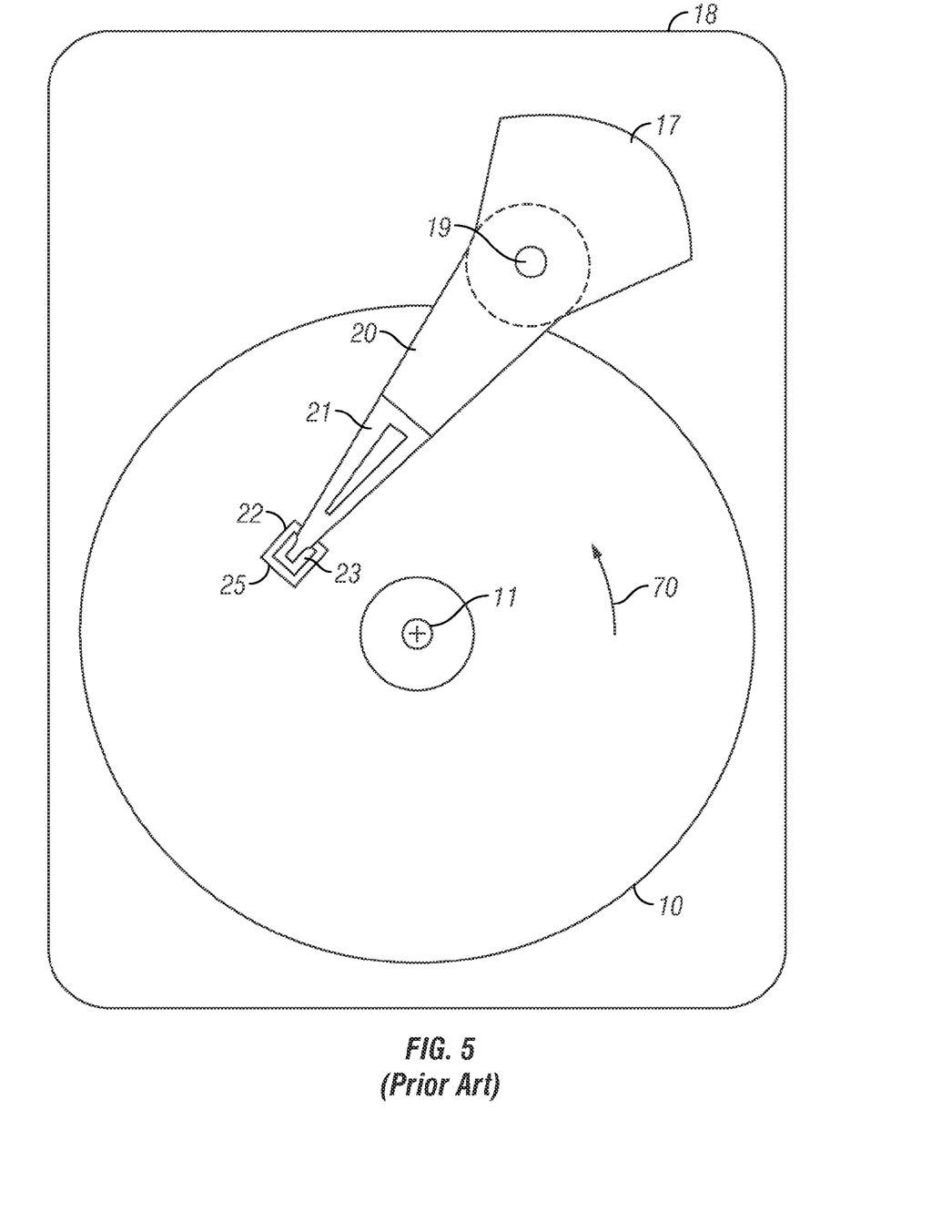
FIG. 5 is a block diagram of a conventional magnetic recording hard disk drive with the cover removed.

FIG. 5 is a block diagram of a conventional magnetic recording hard disk drive with the cover removed. The disk drive includes a magnetic recording disk 10 and a rotary voice coil motor (VCM) actuator 17 supported on a disk drive housing or base 18. The disk 10 has a magnetic recording layer with generally concentric data tracks. The disk 10 has a center of rotation 11 and is rotated in direction 70 by a spindle motor (not shown) mounted to base 18. The actuator 17 pivots about axis 19 and includes a rigid actuator arm 20. A generally flexible suspension 21 includes a flexure element 23 and is attached to the end of arm 20. A head carrier or air-bearing slider 22 is attached to the flexure 23. A magnetic recording read/write head (not shown) is formed on the trailing surface 25 of slider 22. The read/write head typically includes a thin-film patterned coil and write pole that function as an inductive write head, and a magnetoresistive read head. The flexure 23 and suspension 20 enable the slider 22 to "pitch" and "roll" on an air-bearing generated by the rotating disk 10. The graphene EMR sensor according to the invention may function as the magnetoresistive read head in the disk drive of FIG. 5. The graphene EMR sensor may be located on a surface of slider 22 which would serve as the substrate 300 (FIGS. 3, 4A-4B) for the graphene EMR sensor according to the invention.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. An extraordinary magnetoresistance (EMR) sensor comprising:
   a substrate;
   a graphene layer on the substrate;
   a ferromagnetic biasing layer on the substrate between the substrate and the graphene layer and having its magnetic moment oriented generally perpendicular to the planes of the ferromagnetic biasing layer and the graphene layer;
   an electrically insulating underlayer between the ferromagnetic biasing layer and the graphene layer;
   a pair of current leads in contact with the graphene layer for the injection and extraction of current flowing in the graphene layer;
   an electrically conductive shunt in contact with the graphene layer through which current flows in the absence of an external magnetic field;
   a pair of voltage leads in contact with the graphene layer for the detection of a voltage change in response to a decrease in shunted current in the presence of an external magnetic field applied generally perpendicular to the plane of the graphene layer.

2. The sensor of claim 1 wherein the ferromagnetic biasing layer comprises a granular Co alloy.

3. The sensor of claim 1 wherein the ferromagnetic biasing layer is a ferromagnetic multilayer comprising a plurality of like bilayers, said bilayer comprising a first film of Co, Fe or an alloy consisting essentially of Co and Fe and a second film of Pt, Pd or an alloy consisting essentially of Pt and Pd.

4. The sensor of claim 1 wherein the ferromagnetic biasing layer is selected from a chemically-ordered alloy selected from alloys of FePt, CoPt, FePd, CoPd, $CoPt_3$ and $CoPd_3$; and a chemically-ordered $L1_0$ or $L1_1$ phase alloy selected from FePt—X and CoPt—X, where the element X is selected from the group consisting of Ni, Au, Cu, Pd and Ag.

5. The sensor of claim 1 wherein the ferromagnetic biasing layer and the electrically insulating underlayer together comprise a single layer of electrically insulating ferrite.

6. The sensor of claim 1 wherein the ferromagnetic biasing layer comprises a ferromagnetic layer and an antiferromagnetic layer in contact with the ferromagnetic layer, the magnetic moment of the ferromagnetic layer being perpendicularly biased by the antiferromagnetic layer.

7. The sensor of claim 6 wherein the antiferromagnetic layer is located between the substrate and the ferromagnetic layer.

8. The sensor of claim 7 wherein the antiferromagnetic layer is selected from the group consisting of a cobalt oxide, a nickel oxide, an oxide of an alloy of cobalt and nickel, and an alloy comprising Mn and at least one element selected from the group consisting of Pt, Rh, Ni, Fe, Jr and Pd.

9. The sensor of claim 1 wherein the graphene layer is a single atomic layer of graphene.

10. The sensor of claim 1 wherein the graphene layer comprises between 2 and 10 atomic layers of graphene.

11. The sensor of claim 1 wherein the electrically insulating underlayer comprises a layer of hexagonal boron nitride (h-BN).

12. The sensor of claim 11 further comprising a seed layer between the ferromagnetic biasing layer and the h-BN layer for facilitating the growth of the h-BN layer.

13. The sensor of claim 1 further comprising a metallic electrostatic shield layer near the graphene layer and a second electrically insulating layer between the graphene layer and the electrostatic shield layer.

14. An extraordinary magnetoresistance (EMR) sensor comprising:
   a substrate;
   a graphene layer comprising at least one atomic layer of graphene on the substrate;
   a ferromagnetic biasing layer on the substrate between the substrate and the graphene layer and having its magnetic moment oriented generally perpendicular to the planes of the ferromagnetic biasing layer and the graphene layer;
   an electrically insulating underlayer between the ferromagnetic biasing layer and the graphene layer;

an electrically conductive shunt in contact with the graphene layer;

a pair of current leads in contact with the graphene layer for the injection and extraction of current flowing in the graphene layer;

a pair of voltage leads in contact with the graphene layer for the detection of a voltage change in response to an external magnetic field applied generally perpendicular to the graphene layer;

a metallic electrostatic shield layer for the graphene layer; and an electrically insulating overlayer on the graphene layer and between the graphene layer and the electrostatic shield layer.

15. The sensor of claim 14 wherein the electrically insulating underlayer comprises a layer of hexagonal boron nitride (h-BN).

16. The sensor of claim 15 further comprising a seed layer between the ferromagnetic biasing layer and the h-BN layer for facilitating the growth of the h-BN layer.

17. The sensor of claim 14 wherein the ferromagnetic biasing layer comprises a granular Co alloy.

18. The sensor of claim 14 wherein the ferromagnetic biasing layer is a ferromagnetic multilayer comprising a plurality of like bilayers, said bilayer comprising a first film of Co, Fe or an alloy consisting essentially of Co and Fe and a second film of Pt, Pd or an alloy consisting essentially of Pt and Pd.

19. The sensor of claim 14 wherein the ferromagnetic biasing layer is selected from a chemically-ordered alloy selected from alloys of FePt, CoPt, FePd, CoPd, $CoPt_3$ and $CoPd_3$; and a chemically-ordered $L1_0$ or $L1_1$ phase alloy selected from FePt—X and CoPt—X, where the element X is selected from the group consisting of Ni, Au, Cu, Pd and Ag.

20. The sensor of claim 14 wherein the ferromagnetic biasing layer comprises a ferromagnetic layer and an antiferromagnetic layer in contact with the ferromagnetic layer, the magnetic moment of the ferromagnetic layer being perpendicularly biased by the antiferromagnetic layer.

21. The sensor of claim 14 further comprising an air-bearing slider for use in a magnetic recording disk drive, and wherein said slider comprises said substrate.

* * * * *